(12) United States Patent  (10) Patent No.: US 8,451,218 B2
Lota  (45) Date of Patent: May 28, 2013

(54) ELECTRONIC CONTROL MODULE INTERFACE SYSTEM FOR A MOTOR VEHICLE

(75) Inventor: Charan S. Lota, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 419 days.

(21) Appl. No.: 12/904,065

(22) Filed: Oct. 13, 2010

(65) Prior Publication Data

US 2012/0092244 A1     Apr. 19, 2012

(51) Int. Cl.
G09G 5/00     (2006.01)
G06F 3/041    (2006.01)

(52) U.S. Cl.
USPC .......................................... 345/156; 345/173

(58) Field of Classification Search
USPC ................... 345/156–184; 178/18.01–18.09, 178/18.11
See application file for complete search history.

(56) References Cited

U.S. PATENT DOCUMENTS

| 8,094,127 B2 * | 1/2012 | Young ............................ 345/173 |
| 8,164,577 B2 * | 4/2012 | Tsuzaki et al. ................. 345/173 |
| 2003/0142082 A1 | 7/2003 | Spalding |
| 2006/0244733 A1 * | 11/2006 | Geaghan ........................ 345/173 |
| 2007/0209021 A1 | 9/2007 | Chien et al. |
| 2007/0229476 A1 | 10/2007 | Huh |
| 2007/0257896 A1 | 11/2007 | Huh |
| 2008/0303799 A1 | 12/2008 | Schwesig et al. |
| 2009/0066644 A1 | 3/2009 | Endoh et al. |
| 2009/0150785 A1 | 6/2009 | Asami et al. |
| 2009/0251422 A1 | 10/2009 | Wu et al. |
| 2009/0256814 A1 | 10/2009 | Chung et al. |
| 2010/0013774 A1 | 1/2010 | Chen et al. |

FOREIGN PATENT DOCUMENTS

| CN | 101426104 | 5/2009 |
| JP | 10-269022 | 10/1998 |
| JP | 11-312264 | 11/1999 |
| JP | 2004185143 | 7/2004 |
| KR | 2007096367 | 10/2007 |

\* cited by examiner

*Primary Examiner* — Stephen Sherman
(74) *Attorney, Agent, or Firm* — Snell & Wilmer LLP

(57) ABSTRACT

An electronic control module interface system may include a sensing surface having a symbol representative of a function of a motor vehicle, a sensing device coupled to the sensing surface, configured to sense a proximity between a physical pointer and the sensing surface and to generate a browsing signal when the proximity is less than a predefined proximity threshold value, and configured to generate a selection signal when the physical pointer contacts or depresses the sensing surface, and an output device coupled to the sensing device, and configured to produce an output representative of the function of the motor vehicle upon receiving the browsing signal.

19 Claims, 11 Drawing Sheets

ELECTRONIC CONTROL MODULE INTERFACE SYSTEM FOR A MOTOR VEHICLE

BACKGROUND

1. Field

The present invention relates generally to the field of electronic control modules of a motor vehicle, and more particularly to an electronic control module interface system.

2. Description of Related Art

Demand for user friendly motor vehicle control systems continues to grow, driven primarily by consumers who enjoy adjusting various functions of the motor vehicle while driving. For example, a driver may like to adjust the air conditioning temperature, ventilation mode, and/or radio channels while he/she is operating the motor vehicle. However, typical motor vehicles may only have a limited amount of space allocated for the control panel, on which various buttons or dials for controlling various functions of the motor vehicle may be located. As such, these buttons or dials may each have a surface area that is normally less than one square inch, and the symbol printed thereon may have a relatively small size. Therefore, the functions represented by the symbols may be difficult to observe or see.

The driver operating the motor vehicle may usually pay most of his/her attention on the conditions of the road, such that he/she may only use his/her peripheral vision to glance at the symbols for a really short period of time. As such, the information conveyed by the small size symbols may be difficult for the driver to observe and ascertain. The difficulty of observing and ascertaining the content of the symbols may be escalated when the driver has weak eye sight, or when the driver is operating the motor vehicle at night.

Thus, there is a need for an electronic control module interface (ECMI) system that may help reduce a driver's attention span required for observing and ascertaining the function of the buttons located on the control panel of the motor vehicle.

SUMMARY

One embodiment of the present invention may provide an electronic control module interface (ECMI) system which may help reduce the attention span required for observing and ascertaining the function of a particular button. Another embodiment of the present invention is to provide an ECMI system that may notify the driver the functions represented by the symbols of the buttons located on a control panel of the motor vehicle before he/she decides to activate any of the functions.

In one embodiment, an electronic control module interface system may include a sensing surface having a symbol representative of a function of a motor vehicle, a sensing device coupled to the sensing surface, and configured to sense a proximity between a physical pointer and the sensing surface and to generate a browsing signal when the proximity is less than a predefined proximity threshold value, and generate a selection signal when the physical pointer contacts or depresses the sensing surface, and an output device coupled to the sensing device, and configured to produce an output representative of the function of the motor vehicle upon receiving the browsing signal.

In another embodiment, an electronic control module interface system may include a sensing surface having a symbol representative of a function of a motor vehicle, a first sensor coupled to the sensing surface, and configured to sense a perpendicular distance between a physical pointer and the sensing surface and to generate a browsing signal when the perpendicular distance is less than a predefined threshold value, a display device coupled to the first sensor, and configured to receive the browsing signal and to momentarily produce a visual output representative of the function of the motor vehicle upon receiving the browsing signal, a second sensor coupled to the sensing surface, and configured to generate a selection signal when the physical pointer contacts or depresses the sensing surface, and an electronic control module (ECM) coupled to the second sensor, and configured to be activated by the selection signal and to subsequently execute the function of the motor vehicle.

In yet another embodiment, an electronic control module interface system may include a sensing surface having a symbol representative of a function of a motor vehicle, a first sensor coupled to the sensing surface, and configured to sense a perpendicular distance between a physical pointer and the sensing surface and to generate a browsing signal when the perpendicular distance is less than a predefined threshold value, a display device coupled to the first sensor, and configured to receive the browsing signal and to momentarily produce a visual output upon receiving the browsing signal, the visual output enlarging the symbol and describing the function of the motor vehicle, an audio device coupled to the first sensor, and configured to receive the browsing signal and to momentarily produce an audio output descriptive of the function of the motor vehicle upon receiving the browsing signal, a second sensor coupled to the sensing surface, and configured to generate a selection signal when the physical pointer contacts or depresses the sensing surface, and an electronic control module (ECM) coupled to the second sensor, and configured to be activated by the selection signal and to subsequently execute the function of the motor vehicle.

BRIEF DESCRIPTION OF THE DRAWINGS

Other systems, methods, features and advantages of the present invention will be or will become apparent to one with skill in the art upon examination of the following figures and detailed description. It is intended that all such additional systems, methods, features and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Figure 1:
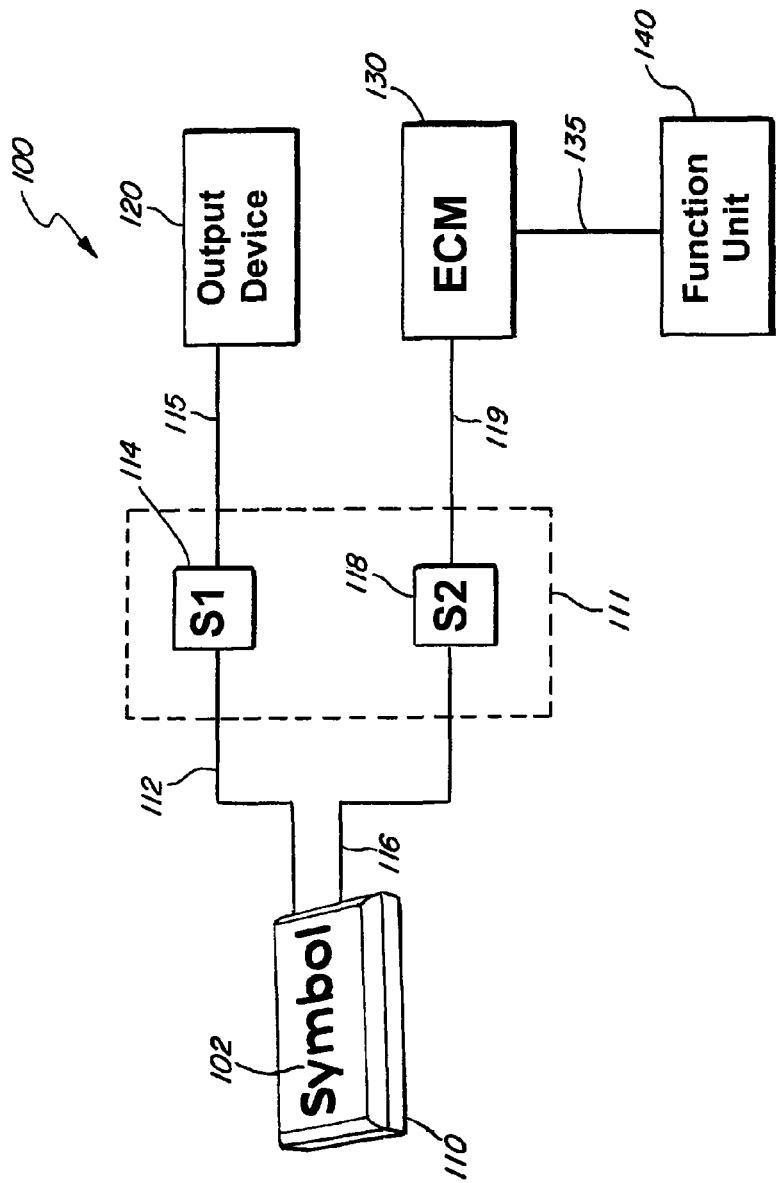
FIG. 1 shows a schematic view of an electronic control module interface system according to an embodiment of the present invention.

In FIG. 1, a schematic view of an electronic control module interface (ECMI) system 100 is shown according to an embodiment of the present invention. Generally, the ECMI system 100 may include a sensing surface 110, a sensing device 111, an output device 120, and an electronic control module (ECM) 130. Particularly, the ECM 130 may be used for initiating, executing, and/or monitoring certain functions of a motor vehicle, which may be performed by a function unit 140. In one embodiment, the function unit 140 may include an air conditioning system, such that the ECM 130 may be used for controlling the air temperature of the interior of the motor vehicle. In another embodiment, the function unit 140 may include an air ventilation system, such that the ECM 130 may be used for controlling the front windshield defrost function, the back windshield defrost function, the air circulation function, and/or the air ventilation selection function of the motor vehicle. In yet another embodiment, the function unit 140 may include a stereo system, such that the ECM 130 may be used for controlling the output volume and for selecting the channels of a radio.

The ECM 130 may be activated and controlled by a user of a motor vehicle, who may be a driver or a passenger. Particularly, the sensing surface 110 may provide a user interface for activating and controlling the ECM 130. Generally, the sensing surface 110 may be an outer part of a button or a dial, which may be located on a control panel of the motor vehicle. In one embodiment, the sensing surface 110 may provide a platform for informing the user the function to be executed when the user interacts with the sensing surface 110. For example, the sensing surface 110 may be printed with a symbol 102, which may briefly inform the user of the function to be invoked should the user choose to engage the sensing surface 110. In another embodiment, the sensing surface 110 may provide a platform for receiving the user's instruction. For example, the sensing surface 110 may be coupled to a sensing device 111, which may be used for detecting the user's instruction.

More specifically, the sensing device 111 may include a first sensor (S1) 114 and a second sensor (S2) 118. The first sensor 114 may be coupled to the sensing surface 110 via a first connection 112, and the second sensor 118 may be coupled to the sensing surface 110 via a second connection 116. In one embodiment, the first and second connections 112 and 116 may be established by conducting wires with low resistivity, such as copper wires, aluminum wires, gold wires, silver wires, and/or fiber optics wires. In another embodiment, the first and second connections 112 and 116 may be established by wireless communication system, such as infrared, blue-tooth, and/or microwave signals or systems.

Because a typical motor vehicle may only have a limited amount of space allocated for the control panel, and because the control panel may have several buttons and/or dials located thereon, the sensing surface 110 may have a surface area that may normally be less than one square inch. Accordingly, the symbol 102 printed on the sensing surface 110 may have a relatively small size. The content of the small size symbol 102 may be difficult to observe and ascertain under many situations. For example, a driver operating the motor vehicle may pay most of his/her attention on the conditions of the road, such that he/she may only use his/her peripheral vision to glance at the symbol 102 for a really short period of time. As such, the content of the small size symbol 102 may be difficult for the driver to observe. The difficulty of observing and ascertaining the content of the symbol 102 may be escalated when the driver is inexperience, has weak eye sight, or operates the motor vehicle at night.

To enhance the observability of the content of the symbol 102, the system 100 may include a mechanism for amplifying and/or clarifying the information conveyed by the symbol 102 when the driver is about to contact or depress one of the several sensing surfaces 110 located on the control panel, and thereby invoking the function of the motor vehicle. According to an embodiment of the present invention, the first sensor 114 may generate a browsing (first) signal when the driver positions a physical pointer about and around the proximity of the sensing surface 110. The physical pointer may be any object capable of making contact and/or depressing the sensing surface 110. Usually, the physical pointer may have a contact surface area that may be about the same or less than the surface area of the sensing surface 110, such that the physical pointer may cover only one sensing surface 110 at a time. For example, the physical pointer may be one of the driver's fingers. For another example, the physical pointer may be an extendable rod.

Normally, the driver may hover or position the physical pointer around and about a button or a dial before making contact with it. When the physical pointer is within the proximity of the sensing surface 110 of a button or a dial, the first sensor 114 may generate the browsing signal, and it may then transmit the browsing signal to the output device 120 via a third connection 115. The proximity of the sensing surface 110 may be a radial distance or a perpendicular distance measured from the center of the sensing surface 110. In one embodiment, the physical pointer may be within the proximity of the sensing surface 110 when it is less than about 2 cm away from the sensing surface 110. In another embodiment, the physical pointer may be within the proximity of the sensing surface 110 when it is less than about 1 cm away from the sensing surface 110. In yet another embodiment, the physical pointer may be within the proximity of the sensing surface 110 when it is less than 50 mm away from the sensing surface 110.

After the browsing signal is generated, the browsing signal may be received by the output device 120. The output device 120 may then process the browsing signal and output a message for notifying the driver of the function represented by the button or dial before he/she may activate or select the function represented by the button or dial. Depending on the type of output device being used in the system, the message may be visual and/or audio. In one embodiment, the message may be a visual image that may enlarge the symbol 102. In another embodiment, the message may be a text that may describe the function represented by the symbol 102. In yet another embodiment, the message may be an audio announcement that may describe the function represented by the symbol 102.

In any event, the system 100 may notify the driver promptly about the function of a button right before he/she may decide to activate that function. In one embodiment, the notification may help reduce the attention span required for ascertaining the function of a particular button. As such, the driver may quickly learn about the function he/she is about to activate without paying close attention to the button he/she is about to press. Advantageously, the system 100 may allow the driver to stay focused on the conditions of the road while interacting with the control panel of the vehicle. Even when the driver is driving at night or even if the driver has poor vision, the system 100 allows the driver to select the correct button without spending much time in observing and ascertaining the function represented by other buttons.

In another embodiment, the notification may help clarify the function represented by the symbol 102. Due to its compact size, the symbol 102 may have a limited amount of complexity such that it may only convey a small amount of information. In some situations, such small amount of information may be sufficient in notifying the driver about the function represented by the symbol 102. In some other situations, however, such small amount of information may be insufficient in clearly informing the driver about the function represented by the symbol 102. Hence, the notification may provide more information to the driver regarding the function represented by the symbol 102. Advantageously, the system 100 may allow the driver to learn about the function of each button in a relatively short period of time and with an improved level of clarity.

The first sensor 114 may be any sensor capable of sensing the presence of the physical pointer when the physical pointer is within the proximity of the sensing surface 110. For example, the first sensor 114 may be a capacity touch sensor, a proximity sensor, and/or an optical sensor.

After the driver is notified with the function of a button, he/she may activate that function or move on to another button, which may be used for activating another function. Depending on the characteristic of the button, the driver may continue making contact with the button or depress the button when he/she decides to activate the function. The second sensor 118 may be used for sensing a continuous contact and/or depression made by the physical pointer, and consequently for generating a selection signal, which may be subsequently transmitted to the ECM 130 via a fourth connection 119. Upon receiving the selection signal, the ECM 130 may be activated, and thereby may send a command signal 135 to the function unit 140 for initiating the function represented by the selected symbol 102 of a particular button.

The second sensor 118 may be any sensor capable of sensing the continuous contact between the physical pointer and the sensing surface 110 and/or the depression of the sensing surface 110. For example, the second sensor 118 may be a capacity touch sensor, a push stroke button sensor, a mechanical sensor, and/or an optical sensor. Moreover, the third and fourth connections 115 and 119 may be established by conducting wires with low resistivity, such as copper wires, aluminum wires, gold wires, silver wires, and/or fiber optics wires, in one embodiment. Alternatively, the third and fourth connections 115 and 119 may be established by wireless communication system, such as infra-red, blue-tooth, and/or microwave signals or systems, in another embodiment.

Although FIG. 1 shows that the first and second sensors 114 and 118 are two individual sensors, the first and second sensors 114 and 118 may be integrated to form a single sensor in an alternative embodiment of the present invention. As such, the single sensor may be used for sensing the proximity of the physical pointer as well as the continuous contact with and/or depression of the sensing surface 110. Consequently, the single sensor may be used for generating both the browsing signal and the selection signal.

Figure 2A:
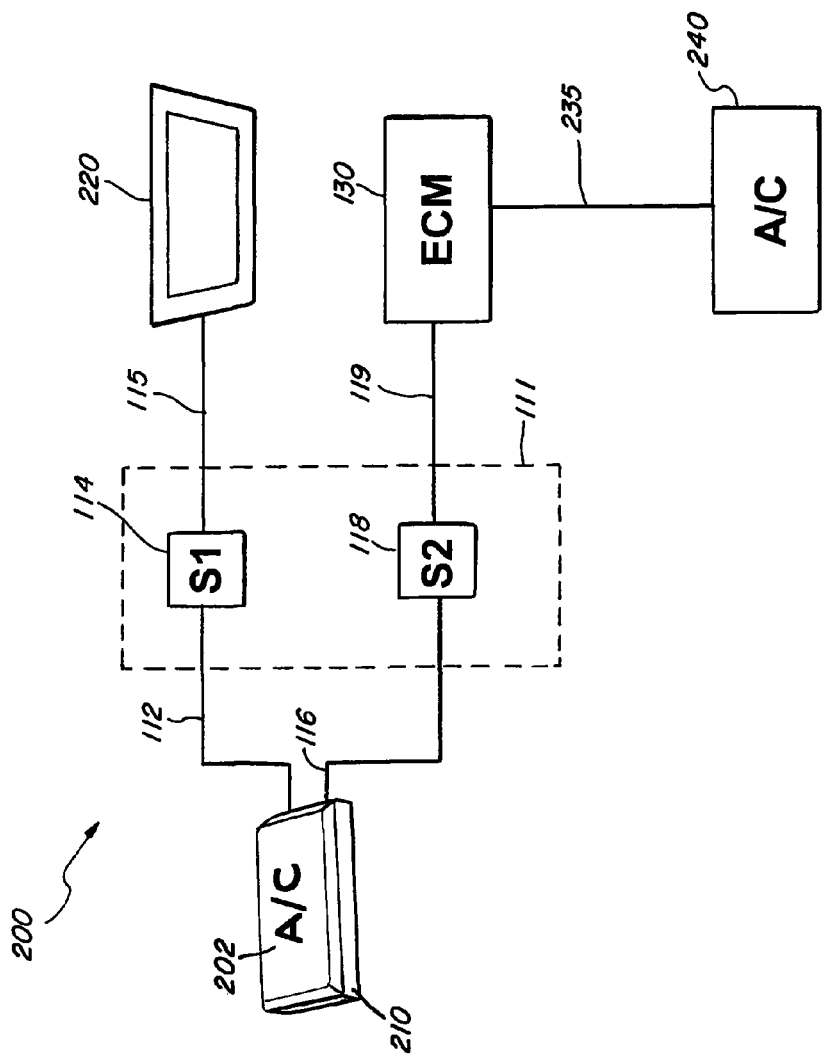
FIG. 2A shows a schematic view of the electronic control module interface system with a display device according to an embodiment of the present invention.

In FIG. 2A, a schematic view of the electronic control module interface (ECMI) system 200 with a display device 220 is shown according to an embodiment of the present invention. The ECMI system 200 may be similar the ECMI system 100. For example, the ECMI system 200 may include a sensing surface 210, an air conditioning (A/C) symbol 202 printed on the sensing surface 210, a sensing device 111, an electronic control module (ECM) 130, and an air conditioning (A/C) function unit 240. Specifically, the ECMI system 200 may include a display device 220 to realize a few of the functional features of the output device 120.

Figure 2B:
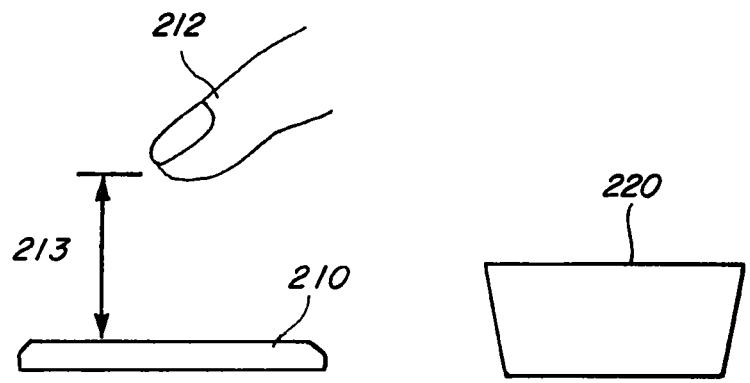
FIGS. 2B-2D show the side views of the electronic control module interface system with the display device according to an embodiment of the present invention.

As discussed in FIG. 1, the sensing device 111 may include the first and second sensors 114 and 118. The first sensor 114 may be used for sensing the presence of the physical pointer when it is placed within the proximity of the sensing surface 210, while the second sensor 118 may be used for sensing the presence of the physical pointer when it contacts with or depresses the sensing surface 210. As shown in FIG. 2B, the physical pointer 213 may be an index finger of the driver, which may be positioned beyond a threshold distance 212 above the sensing surface 210.

The threshold distance 212 may be a vertical distance measured from the sensing surface 210 and the threshold distance may be used to predefine a proximity threshold value for the purpose of generating the browsing signal. In one embodiment, the threshold distance 212 may range, for example, from about 0 cm to about 2 cm. In another embodiment, the threshold distance 212 may range, for example, from about 1 mm to about 1 cm. In yet another embodiment, the threshold distance 212 may range, for example, from about 10 mm to about 50 mm.

When the physical pointer 213 is placed outside of the proximity of the sensing surface 210, the first sensor 114 may be at an idle state such that it may generate an idle signal, which may be transmitted to the display device 220 via the third connection 115. At this stage, the display device 220 may only produce background visual images describing the current operation status of the motor vehicle. For example, the background visual images may report the current A/C output temperature, the current fan speed, and/or the current ventilation outlet.

Figure 2C:
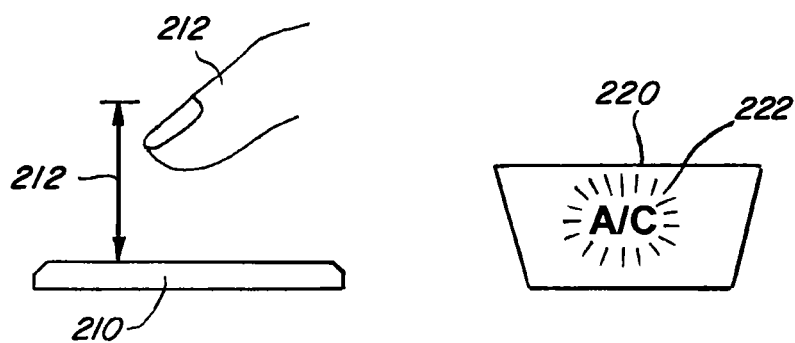

Referring to FIG. 2C, the physical pointer 213 may be hovered below the threshold distance 212 such that it may be positioned within the proximity of the sensing surface 210. Accordingly, the first sensor 114 may detect the presence of the physical pointer 213 and generate the browsing signal, which may then be transmitted to the display device 220 via the third connection 115.

After receiving and processing the browsing signal, the display device 220 may produce a browsing visual image 222 according to an embodiment of the present invention. The browsing visual image 222 may be an image that enlarges the symbol 202, and may appear in front of the background visual images momentarily or as long as the physical pointer 213 is positioned within the proximity of the sensing surface 210. In one embodiment, the browsing visual image 222 may be displayed on the display device 220 for an extended time period (e.g., 1-10 seconds) after the physical pointer 213 is removed from the proximity of the sensing surface 210. This advantageously allows the driver or passenger to see the browsing visual image 222 for a longer period of time without requiring the physical pointer 213 to be positioned proximate to the sensing surface 210. Moreover, the browsing visual image 222 may be a steady image, a flashing image and/or a glossy image according to various embodiments of the invention.

The browsing visual image 222 may notify the driver about the function he/she may be about to activate. Due to its readily observable feature, the browsing visual image 222 may require little attention from the driver before he/she may ascertain the content carried by the symbol 202. By simply glancing at the browsing image 222 that appears in the display device 220, the driver may quickly learn that the sensing surface 210 may be selected to activate the air conditioning function of the motor vehicle. Advantageously, the driver may stay focused and pay close attention to the conditions of the road while learning about the function of a particular button.

Figure 2D:
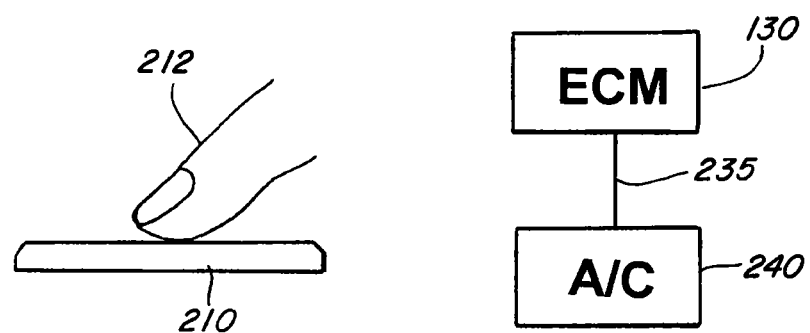

After the driver learns about the function of a particular button, he/she may move on to another button or activate the function by contacting or depressing the sensing surface of the current button. In order to activate the air conditioning function, for example, the physical pointer 213 may be placed into contact with the sensing surface 210 as shown in FIG. 2D.

Alternatively, the physical pointer 213 may be used for depressing the sensing surface 210 in order to activate the air conditioning function. In either case, the second sensor 228 may sense the contact with or depression of the sensing surface 210, and it may generate the selection signal, which may be transmitted to the ECM 130 via the fourth connection 119. After receiving the selection signal, the ECM 130 may be activated, and it may thus send an air conditioning command signal 235 to the air conditioning function unit 240 for performing the air conditioning task.

To affirm that the proper function is being selected and initiated, the system 200 may turn the browsing image 222 into a selecting image (not shown), which may be a brighter version of the browsing image 222 according to an embodiment of the present invention. Alternatively, the system 200 may turn off the browsing image 222 when the function is being properly initiated.

Figure 3A:
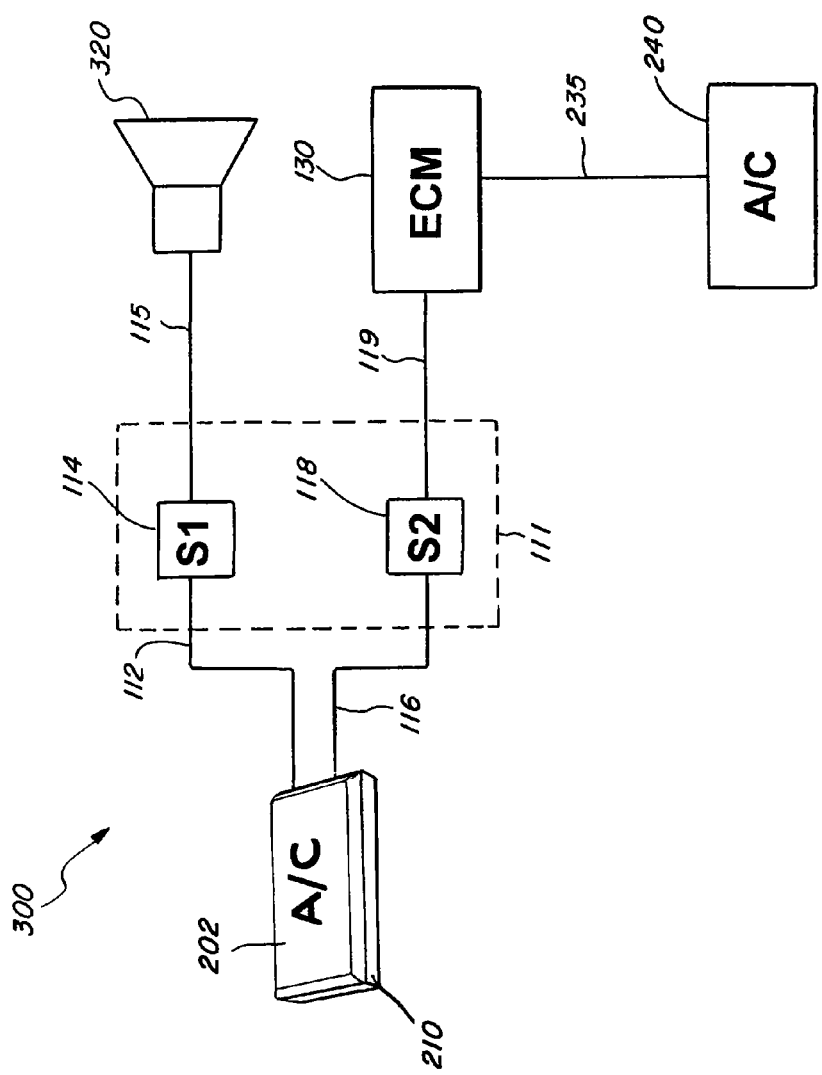
FIG. 3A shows a schematic view of the electronic control module interface system with an audio device according to an embodiment of the present invention.

In FIG. 3A, a schematic view of the electronic control module interface (ECMI) system 300 with an audio device 320 is shown according to an embodiment of the present invention. The ECMI system 300 may be similar to the ECMI system 200. For example, the ECMI system 300 may include the sensing surface 210, the air conditioning (A/C) symbol 202 displayed or printed on the sensing surface 210, the sensing device 111, the electronic control module (ECM) 130, and the air conditioning (A/C) function unit 240. Specifically, the ECMI system 300 may include an audio device 320 to realize a few of the functional features of the output device 120.

Figure 3B:
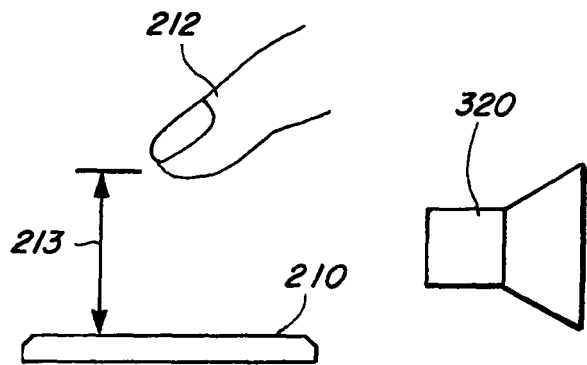
FIGS. 3B-3D show the side views of the electronic control module interface system with the audio device according to an embodiment of the present invention.

As shown in FIG. 3B, when the physical pointer 213 is placed outside of the proximity of the sensing surface 210, the first sensor 114 may be at an idle state such that it may generate an idle signal, which may be transmitted to the display device 220 via the third connection 115.

At this stage, the audio device 320 may only produce background audio output generated by a stereo system of the motor vehicle, or alternatively, it may produce no audio output at all. For example, the background audio output may be a broadcast from a radio station, an instruction given by a global positioning system (GPS) device, or a song played from a compact disc (CD).

Figure 3C:
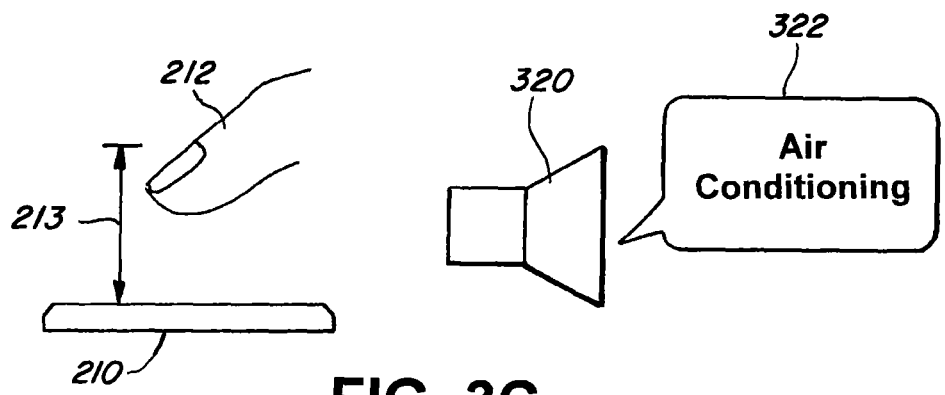

Referring to FIG. 3C, the physical pointer 213 may be hovered or placed below the threshold distance 212 such that it may be positioned within the proximity of the sensing surface 210. Accordingly, the first sensor 114 may detect the presence of the physical pointer 213 and generate the browsing signal, which may then be transmitted to the audio device 320 via the third connection 115. After receiving and processing the browsing signal, the audio device 320 may produce a browsing audio message 322 according to an embodiment of the present invention.

The browsing audio message 322 may be a message that describes the meaning of the symbol 202. For example, the audio message 322 may read "Air Conditioning" when the physical pointer 213 is placed within the proximity of the sensing surface 210, which may be displayed or printed with the A/C symbol 202. While the browsing audio message 322 is being played, the volume of the background audio output may be reduced or muted. The browsing audio message 322 may be played once, twice, or a predetermined number of times, or iteratively as long as the physical pointer 213 is positioned within the proximity of the sensing surface 210. Moreover, the browsing audio message 322 may be delivered by a male voice, a female voice, or a computerized voice, and the browsing audio message 322 may be delivered in various languages, including but not limited to, Chinese, Spanish, English, Bengali, Hindi, Arabic, Portuguese, Russian, Japanese, German, and French.

At this stage, the browsing audio message 322 may notify the driver about the function he/she may be about to activate. Due to its readily perceivable feature, the browsing audio message 322 may require little attention from the driver before he/she may ascertain the content represented by the symbol 202. By simply listening to the browsing audio message 322, the driver may quickly learn that a particular button may be selected to activate the air conditioning function of the motor vehicle. Advantageously, the driver may stay focused and pay close attention to the conditions of the road while learning about the function of the particular button.

Figure 3D:
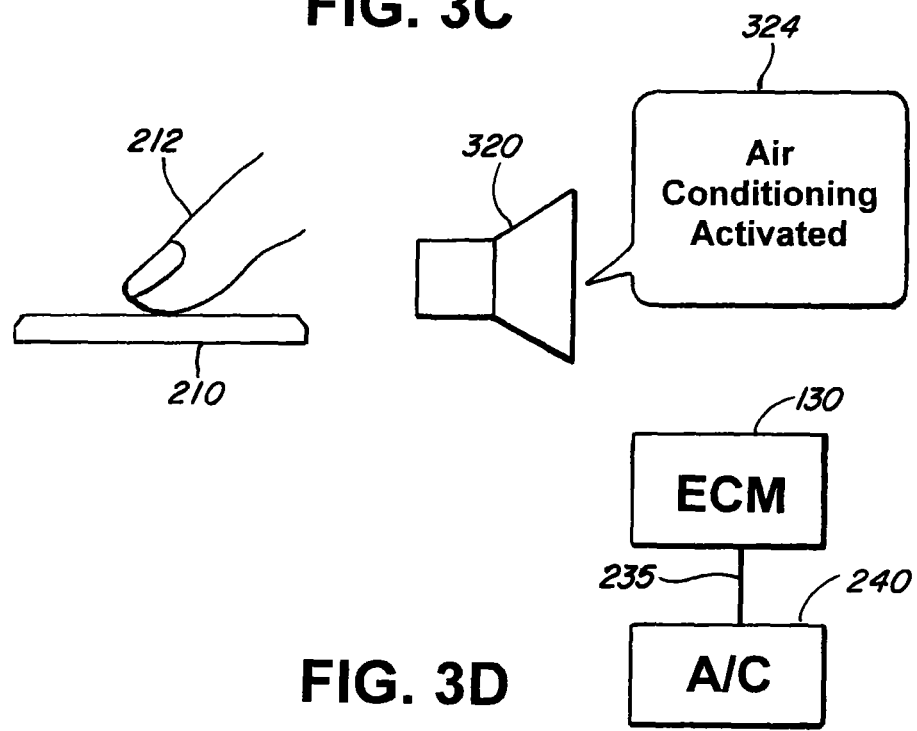

After the driver learns about the function of the particular button, he/she may move on to another button or activate the function by contacting or depressing the sensing surface of the current button. In order to activate the air conditioning function, for example, the physical pointer 213 may be placed into contact with the sensing surface 210 as shown in FIG. 3D. Alternatively, the physical pointer 213 may be used for depressing the sensing surface 210 in order to activate the air conditioning function. In either case, the second sensor 228 may sense the contact with or depression of the sensing surface 210, and it may generate the selection signal, which may be transmitted to the ECM 130 via the fourth connection 119. After receiving the selection signal, the ECM 130 may be activated, and it may thus send an air conditioning command signal 235 to the air conditioning function unit 240 for performing the air conditioning task.

To affirm that the proper function is being selected and initiated, the system 200 may replace the browsing audio message 322 with a selection audio message 324 according to an embodiment of the present invention. When the air conditioning function is properly initiated, for example, the audio device 320 may produce the selection audio message 324, which may read "Air Conditioning Activated." Similar to the browsing audio message 322, the selection audio message 324 may be delivered by a male voice, a female voice, or a computerized voice, and the selection audio message 324 may be delivered in various languages, including but not limited to, Chinese, Spanish, English, Bengali, Hindi, Arabic, Portuguese, Russian, Japanese, German, and French. Alternatively, the system 200 may stop playing the browsing audio message 322 and resume the background audio output when the function is being properly initiated.

As shown in both FIGS. 1, 2A and 3A, the ECMI systems 100, 200 and 300 may all adopt a direct output configuration, in which the first sensor 114 may be directly connected to the output device 120, the display device 220, or the audio device 320. As such, each of the output device 120, the display device 220, and the audio device 320 may include a processor for processing the browsing signal and a memory for retrieving the output information used for producing the visual and/or audio outputs.

The processor can be any computing device capable of receiving data, processing the received data, and outputting the processed data. For example, the processor can be coupled to the first sensor 114, the output device 120, the display device 220, and/or the audio device 320. The processor may be implemented using hardware, software, firmware, middleware, microcode, or any combination thereof. The processor may be an Advanced RISC Machine (ARM), a computer, a controller, a digital signal processor (DSP), a microprocessor, circuitry, a processor chip, or any other device capable of processing data, and combination thereof. Moreover, the memory may include or store various routines and data. The term "memory" includes, but is not limited to, random access memory (RAM), flash memory, read-only memory (ROM), EPROM, EEPROM, registers, hard disk, removable disk, CD-ROM, DVD, Blu-ray disk, wireless channels, and various other media capable of storing, containing or carrying instruction(s) and/or data.

Alternatively, the ECMI systems 100, 200 and 300 may all adopt an intermediate output configuration, in which the first sensor 114 may be connected intermediately to the ECM 130, which may in return, be connected to the output device 120, the display device 220, and/or the audio device 320. More specifically, the first sensor 114 may generate the browsing signal for the ECM 130, and the ECM 130 may generate an output command signal to the output device 120, the display device 220, and/or the audio device 320 for producing the proper browsing output.

Furthermore, although FIGS. 1, 2A, and 3A show that the ECMI systems 100, 200, and 300 each only include one type of output device, an alternative ECMI system may include more than one types of output devices. In one embodiment, for example, the alternative ECMI system may include both the display device 220 and the audio device 320. Accordingly, the browsing signal may cause the display device 220 to produce the browsing visual image 222 and cause the audio device 320 to produce the browsing audio message 322. Advantageously, the driver may receive both the browsing visual image 222 and the browsing audio message 322 at about the same moment of time, such that the driver may learn about the function he/she is about to activate in a more efficient manner.

Figure 4:
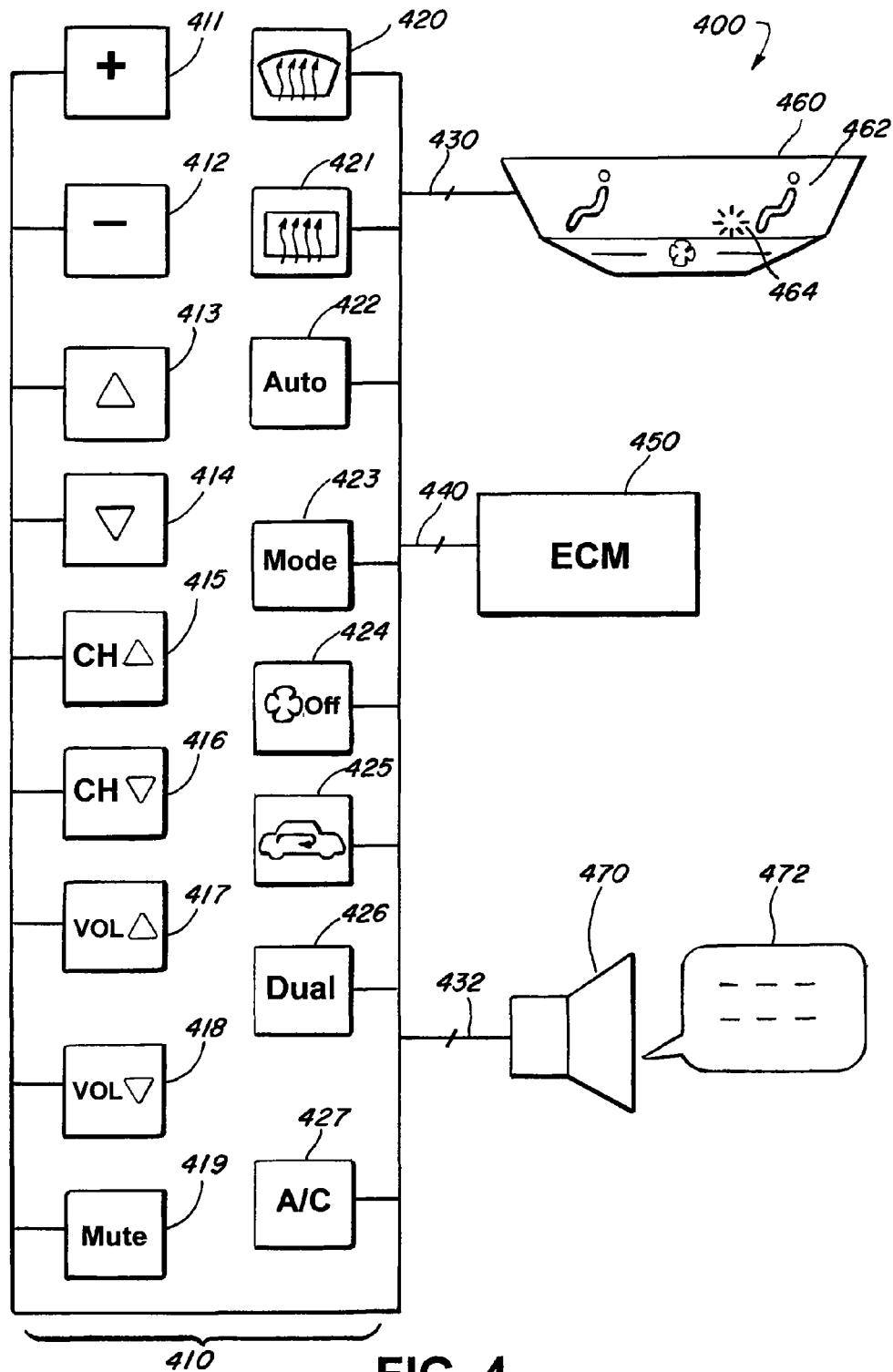
FIG. 4 shows a schematic view of a multifunction electronic control module interface system with a direct output configuration according to an embodiment of the present invention.

The discussion now turns to a multifunction electronic control module interface system, which may include various buttons and/or sensing surfaces for activating various functions of the motor vehicle. In FIG. 4, a schematic view of a multifunction electronic control module interface (ECMI) system 400 with a direct output configuration is shown according to an embodiment of the present invention. Generally, the multifunction ECMI system 400 may include a user interface panel (a.k.a. a control panel) 410, an electronic control module 450, a display device 460, and optionally, an audio device 470.

The user interface panel 410 may include several buttons and/or dials, each of which may include the sensing surface 110 and the sensing device 111 as discussed in FIG. 1. More specifically, the sensing surface 110 may include the symbol 102 for describing the function of the respective button or dial, and the sensing device 111 may include a first sensor for sensing the presence of the physical pointer when it is positioned within the proximity of the sensing surface, and a second sensor for sensing the contact with, or the depression of, the sensing surface made by physical pointer. Accordingly, each of the buttons or dials may generate a browsing signal and a selection signal as discussed in FIG. 1.

As shown in FIG. 4, the user interface panel 410 may include one or more buttons and/or dials for controlling various functions of the motor vehicle. To control the air conditioning function of the motor vehicle, for example, the user interface panel 410 may include an air conditioning power on button 427, a temperature up button 411, a temperature down button 412, a dual climate control button 426, and/or an automatic temperature adjustment button 422. To control the air ventilation function of the motor vehicle, the user interface panel 410 may include a fan power off button 424, an air circulation button 424, a ventilation mode selection button 423, a fan speed up button 413, a fan speed down button 414, a front windshield defrost button 420, and/or a back windshield defrost button 421. To control the stereo system of the motor vehicle, for yet another example, the user interface panel 410 may include a channel up button 415, a channel down button 416, a volume up button 417, a volume down button 417, and/or a mute button 419.

The display device 460 may be connected directly to each of the buttons or dials located on the user interface panel 410, and the display device 460 may receive a browsing signal bus 430, which may be used for transmitting all the browsing signals. Therefore, the display device 460 may produce one browsing visual image 464 for each of the browsing signals received, such that the browsing visual image 464 may cover a background visual image 462 momentarily or as long as the physical pointer may be positioned within the proximity of a particular sensing surface of a particular button or dial. In one embodiment, the browsing visual image 464 may be displayed on the display device 460 for an extended time period (e.g., 1-10 seconds) after the physical pointer is removed from the proximity of the sensing surface. This advantageously allows the driver or passenger to see the browsing visual image 464 for a longer period of time without requiring the physical pointer to be positioned proximate to the sensing surface.

In one embodiment, the browsing visual image 464 may enlarge the symbol of each button. For example, an enlarged image of the dual climate control symbol "DUAL" may be displayed when the physical pointer is positioned within the proximity of the sensing surface of the dual climate control button 426. In another embodiment, the browsing visual image 464 may describe the function of each button. For example, a text "DUAL CLIMATE CONTROL" may be displayed when the physical pointer is positioned within the proximity of the sensing surface of the dual climate control button 426. Moreover, the browsing visual image 464 may be a steady image, a flashing image, or a glossy image according to various embodiments of the present invention.

The ECM 450 may be connected directly to each of the buttons or dials located on the user interface panel 410, and the ECM 450 may receive a selection signal bus 440, which may be used for transmitting all the selection signals. Consequentially, the ECM 450 may be activated, such that it may generate one or more initiation command for invoking one or more function units located inside the motor vehicle.

Optionally, the audio device 470 may be connected directly to each of the buttons or dials located on the user interface panel 410, and the audio device 460 may receive an optional browsing signal bus 432, which may be used for transmitting all the browsing signals. Consequentially, the audio device 470 may produce one browsing audio message 472 for each of the browsing signals received, such that the browsing audio message 472 may speak over a background audio output, which may be produced by a radio, a CD player, or a GPS device.

In one embodiment, the browsing audio message 472 may describe the function of each button. For example, a browsing audio message "Ventilation Mode Selection" may be announced when the physical pointer is positioned within the proximity of the sensing surface of the ventilation mode selection button 423. In another embodiment, the browsing audio message 472 may explain the function of each button. For example, a browsing audio message "PLEASE SELECT A VENTILATION MODE. PRESS THE VENTILATION MODE BUTTON ONE TIME IF YOU WANT THE AIR TO BE DELIVERED FROM THE FRONT PORTAL, TWO TIMES IF YOU WANT THE AIR TO BE DELIVERED FROM THE SIDE PORTAL . . . " may be announced when the physical pointer is positioned within the proximity of the sensing surface of the ventilation mode selection button 423.

Figure 5:
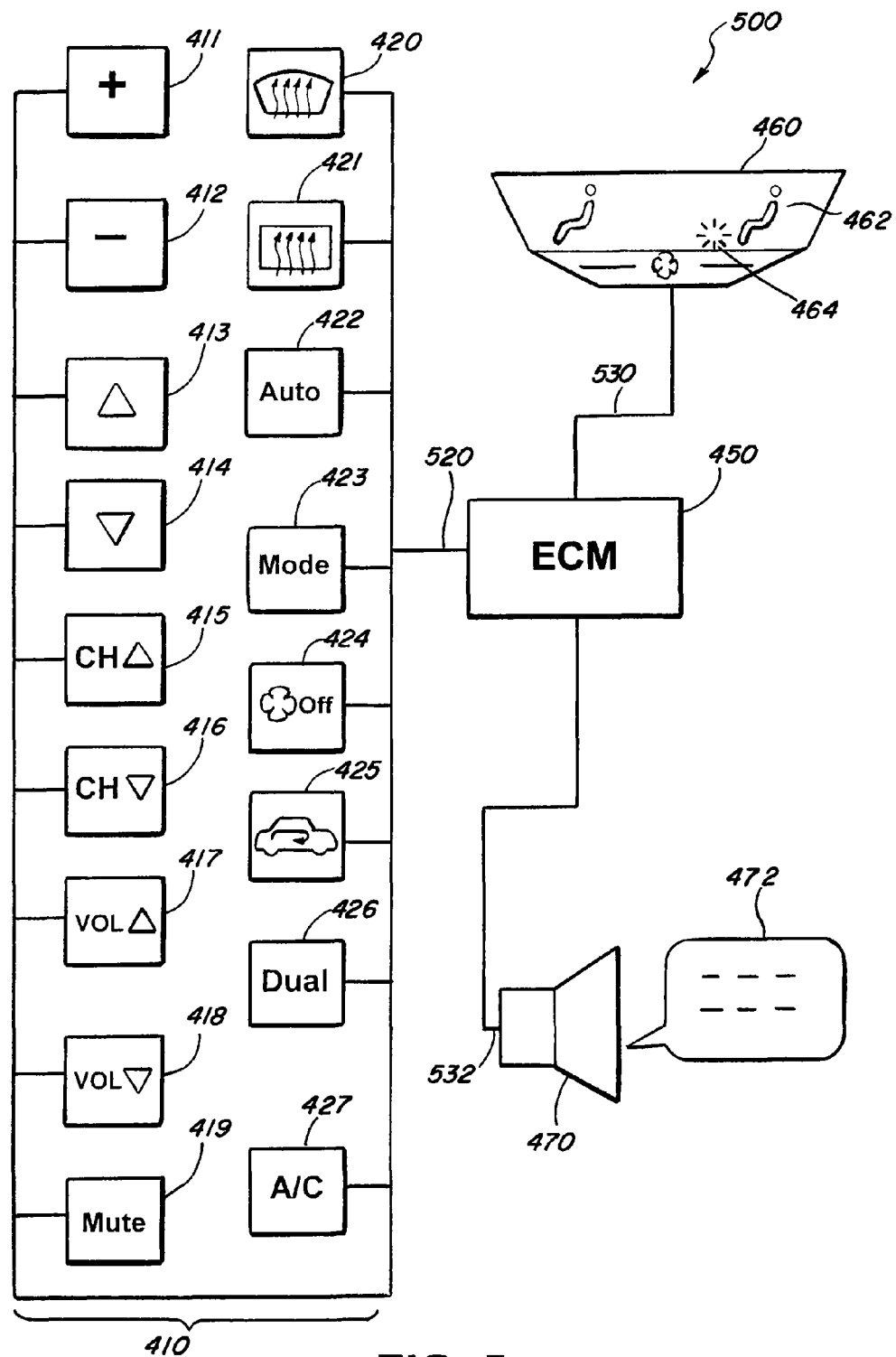
FIG. 5 shows a schematic view of a multifunction electronic control module interface system with an intermediate output configuration according to an embodiment of the present invention.

In FIG. 5, a schematic view of a multifunction electronic control module interface (ECMI) system 500 with an intermediate output configuration is shown according to an embodiment of the present invention. Generally, the multifunction ECMI system 500 may include similar components as the multifunction ECMI system 400. For example, the multifunction ECMI system 500 may include the user interface panel 410, the ECM 450, the display device 460, and the optional audio device 470.

However, the multifunction ECMI system 500 may be different from the multifunction ECMI system 400 in at least one aspect. For example, the multifunction ECMI system 500 may adopt the intermediate output configuration, in which the ECM 450 may receive and process both the browsing signals and the selection signals. More specifically, the browsing signals may be integrated with the selection signals to form a sensing signal bus 520. The ECM 450 may receive the sensing signal bus 520, and it may then process the browsing signals and the selection signals simultaneously. For example, the ECM 450 may generate a visual output signal 530 based on the browsing signals, such that the display device 460 may produce the corresponding browsing visual image 464. For another example, the ECM 450 may generate an audio output signal 532 based on the browsing signals, such that the audio device 470 may produce the corresponding browsing audio message 472.

Advantageously, the ECM 450 may synchronize the operation of the function unit, the display device 460, and the audio device 470. In one embodiment, the ECM 450 may determine and/or predict a transition of the physical pointer from one sensing surface to another sensing surface, so as to prevent the premature initiation of a particular function unit. In another embodiment, the ECM 450 may coordinate the deliveries of the browsing visual image 464 and the browsing audio message 472, so that the driver may receive these two outputs simultaneously or sequentially. In yet another embodiment, the ECM 450 may allow the driver or user to select one form of browsing output over the other (e.g., the browsing visual image 464 over the browsing audio message 472, or the browsing audio message 472 over the browsing visual image 464).

Figure 6A:
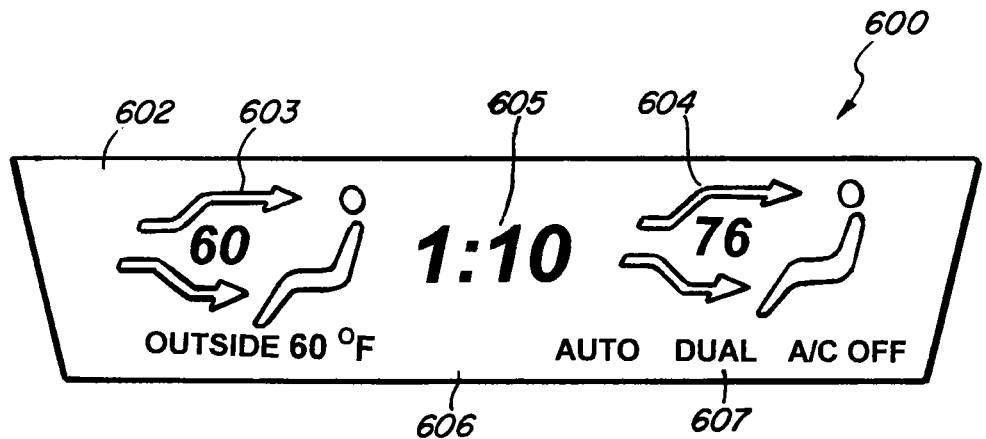
FIGS. 6A-6H show various front views of an exemplary multifunction electronic control module interface system, which may be used for sensing the presence of a physical pointer according to an embodiment of the present invention.

FIGS. 6A-6H show various front views of an exemplary multifunction electronic control module interface (ECMI) system 600, which may be used for sensing the presence of a physical pointer. In FIG. 6A, the display device 602 may show various background visual images when the system is at the idle state. For example, the background visual images may report the air conditioning temperatures for the driver side 603 and the front passenger side 604, the current time 605, the fan speed 606, and/or the status of the dual climate control mode 607.

Figure 6B:
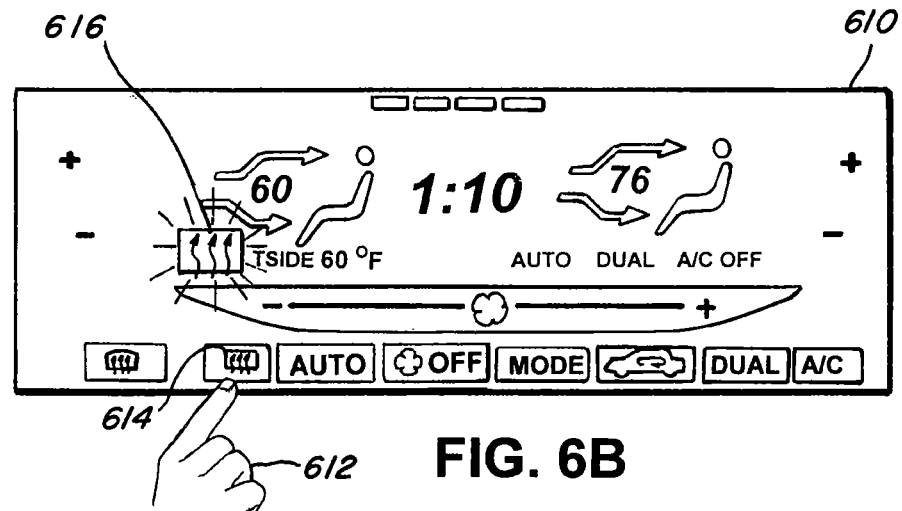

In FIG. 6B, the system 600 may transit from the idle state to a back windshield defrost browsing state 610 when the physical pointer 612 hovers or moves about the sensing surface of the back windshield defrost button 614. In the state 610, the first sensor of the back windshield defrost button 614 may generate a browsing signal. Consequentially, the display device 602 may receive the browsing signal and produce the corresponding browsing visual image 616, which may be displayed over the background visual images.

Figure 6C:
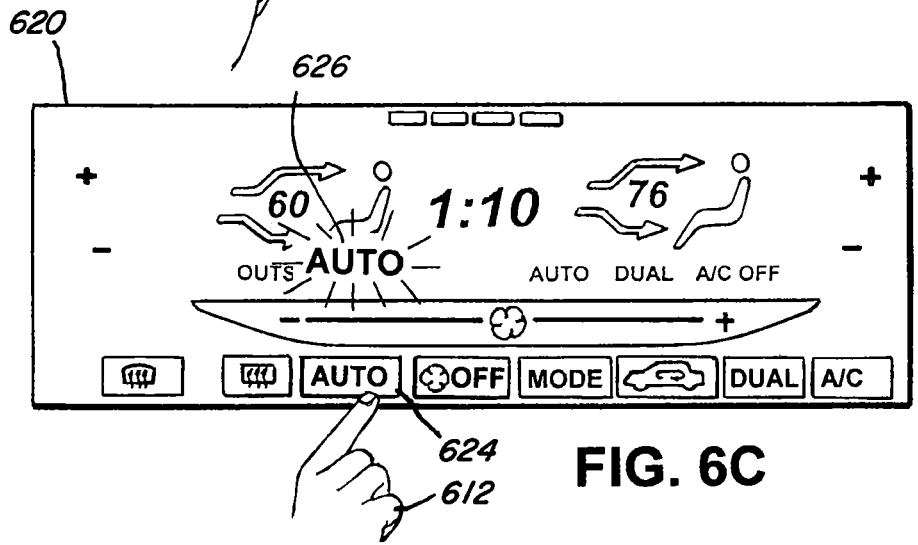

In FIG. 6C, the system 600 may transit from the back windshield defrost browsing state 610 to an automatic temperature adjustment browsing state 620 when the physical pointer 612 hovers or moves from the proximity of the back windshield defrost button 614 to the proximity of the automatic temperature adjustment button 624. In the state 620, the first sensor of the automatic temperature adjustment button 624 may generate a browsing signal. Consequentially, the display device 602 may receive the browsing signal and produce the corresponding browsing visual image 626, which may be displayed over the background visual images.

Figure 6D:
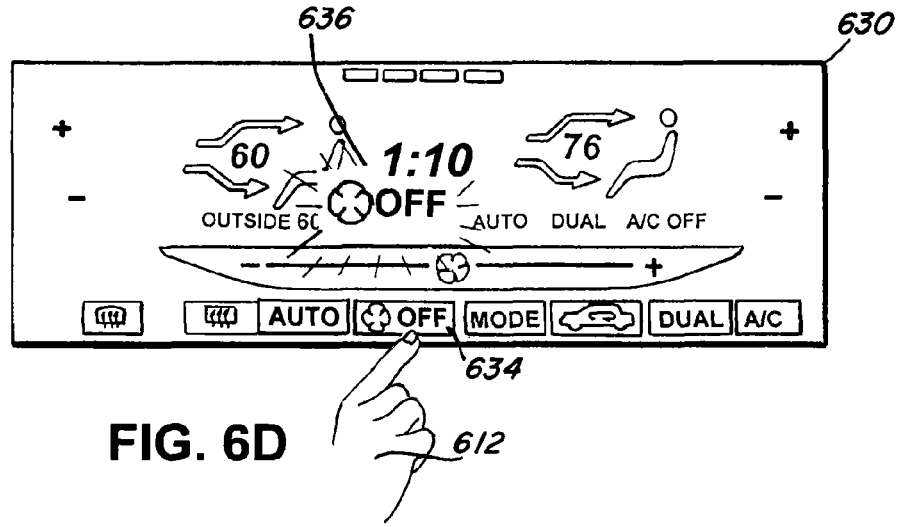

In FIG. 6D, the system 600 may transit from the automatic temperature adjustment browsing state 620 to a fan off browsing state 630 when the physical pointer 612 hovers or moves from the proximity of the automatic temperature adjustment button 624 to the proximity of the fan power off button 634. In the state 630, the first sensor of the fan power off button 634 may generate a browsing signal. Consequentially, the display device 602 may receive the browsing signal and produce the corresponding browsing visual image 636, which may be displayed over the background visual images.

Figure 6E:
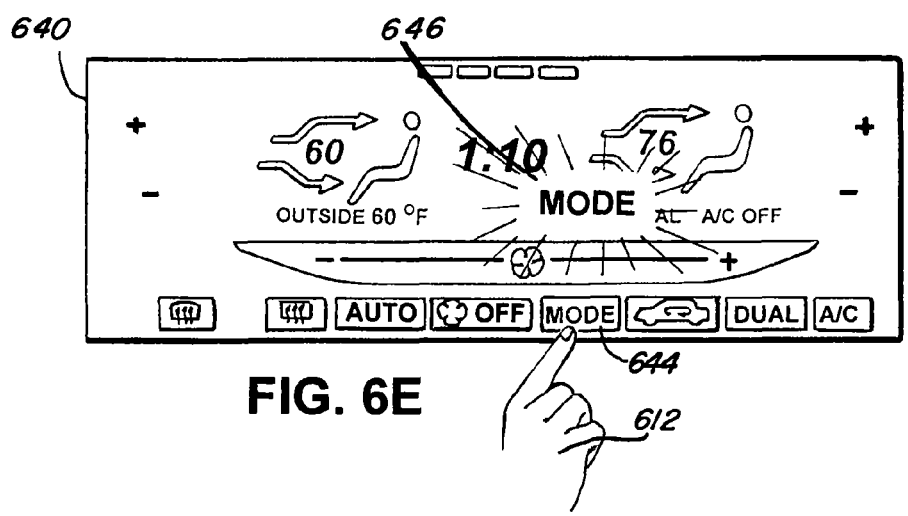

In FIG. 6E, the system 600 may transit from the fan off browsing state 630 to a ventilation mode selection browsing state 640 when the physical pointer 612 hovers or moves from the proximity of the fan power off button 634 to the proximity of the ventilation mode selection button 644. In the state 640, the first sensor of the ventilation mode selection button 644 may generate a browsing signal. Consequentially, the display device 602 may receive the browsing signal and produce the corresponding browsing visual image 646, which may be displayed over the background visual images.

Figure 6F:
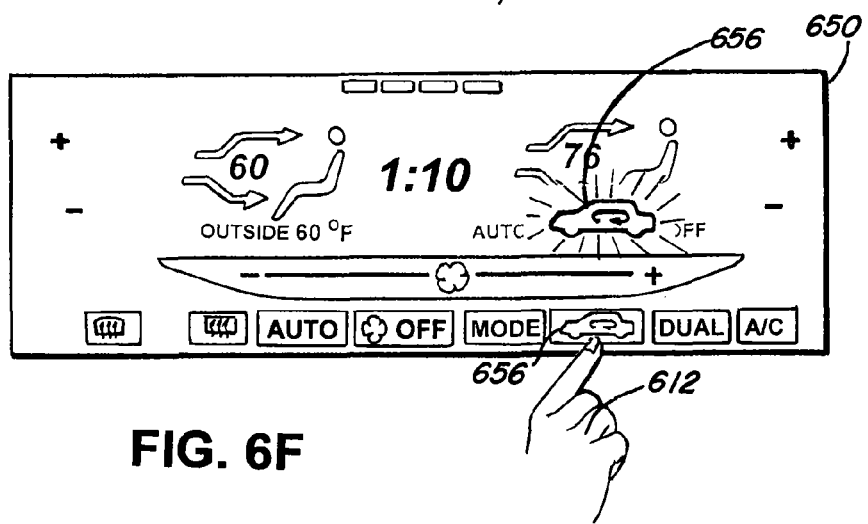

In FIG. 6F, the system 600 may transit from the ventilation mode selection browsing state 640 to an air circulation browsing state 650 when the physical pointer 612 hovers or moves from the proximity of the ventilation mode selection button 644 to the proximity of the air circulation button 654. In the state 650, the first sensor of the air circulation button 654 may generate a browsing signal. Consequentially, the display device 602 may receive the browsing signal and produce the corresponding browsing visual image 656, which may be displayed over the background visual images.

Figure 6G:
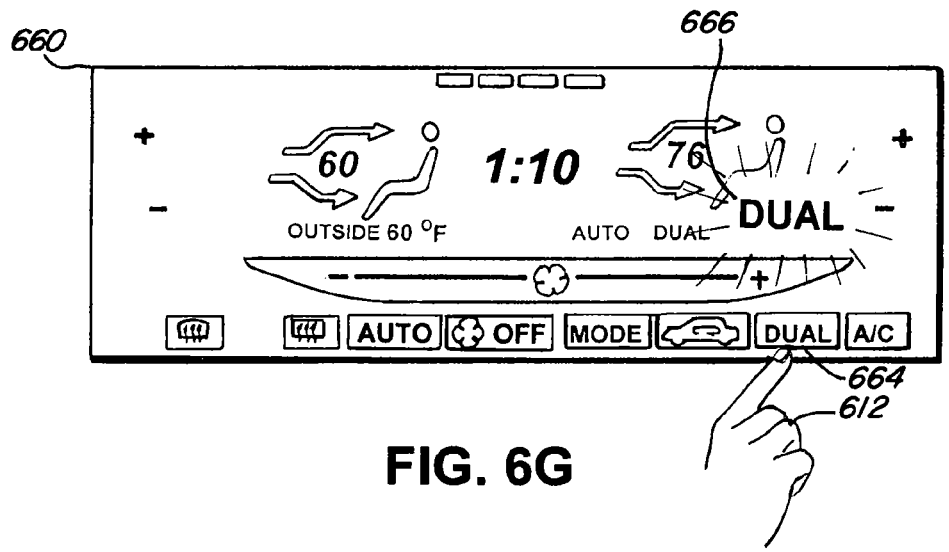

In FIG. 6G, the system 600 may transit from the air circulation browsing state 650 to a dual climate control browsing state 660 when the physical pointer 612 hovers or moves from the proximity of the air circulation button 654 to the proximity of the dual climate control button 664. In the state 660, the first sensor of the dual climate control button 664 may generate a browsing signal. Consequentially, the display device 602 may receive the browsing signal and produce the corresponding browsing visual image 666, which may be displayed over the background visual images.

Figure 6H:
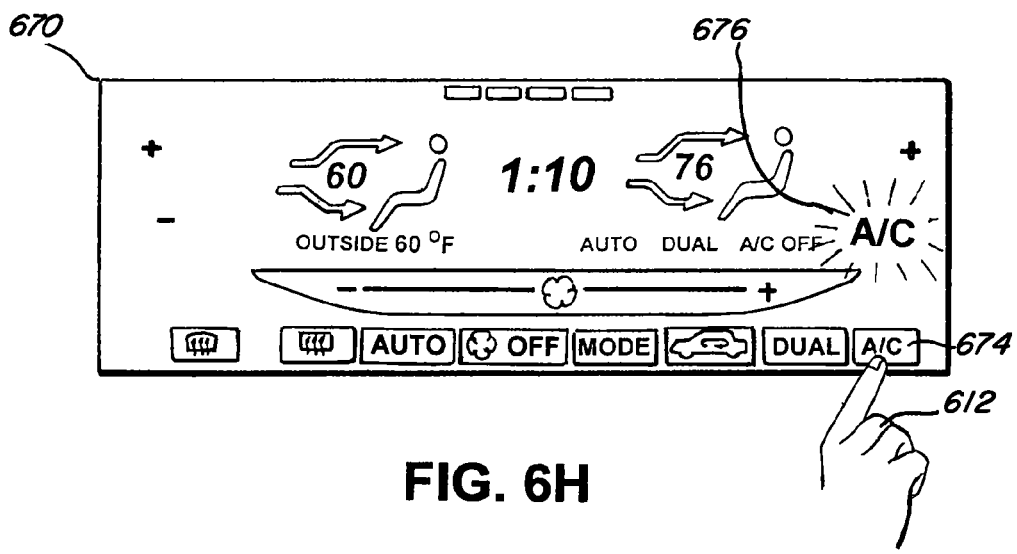

In FIG. 6H, the system 600 may transit from the dual climate control browsing state 660 to an air conditioning on browsing state 670 when the physical pointer 612 hovers or moves from the proximity of the dual climate control button 664 to the proximity of the air conditioning power on button 674. In the state 670, the first sensor of the air conditioning power on button 674 may generate a browsing signal. Consequentially, the display device 602 may receive the browsing signal and produce the corresponding browsing visual image 676, which may be displayed over the background visual images.

Figure 7:
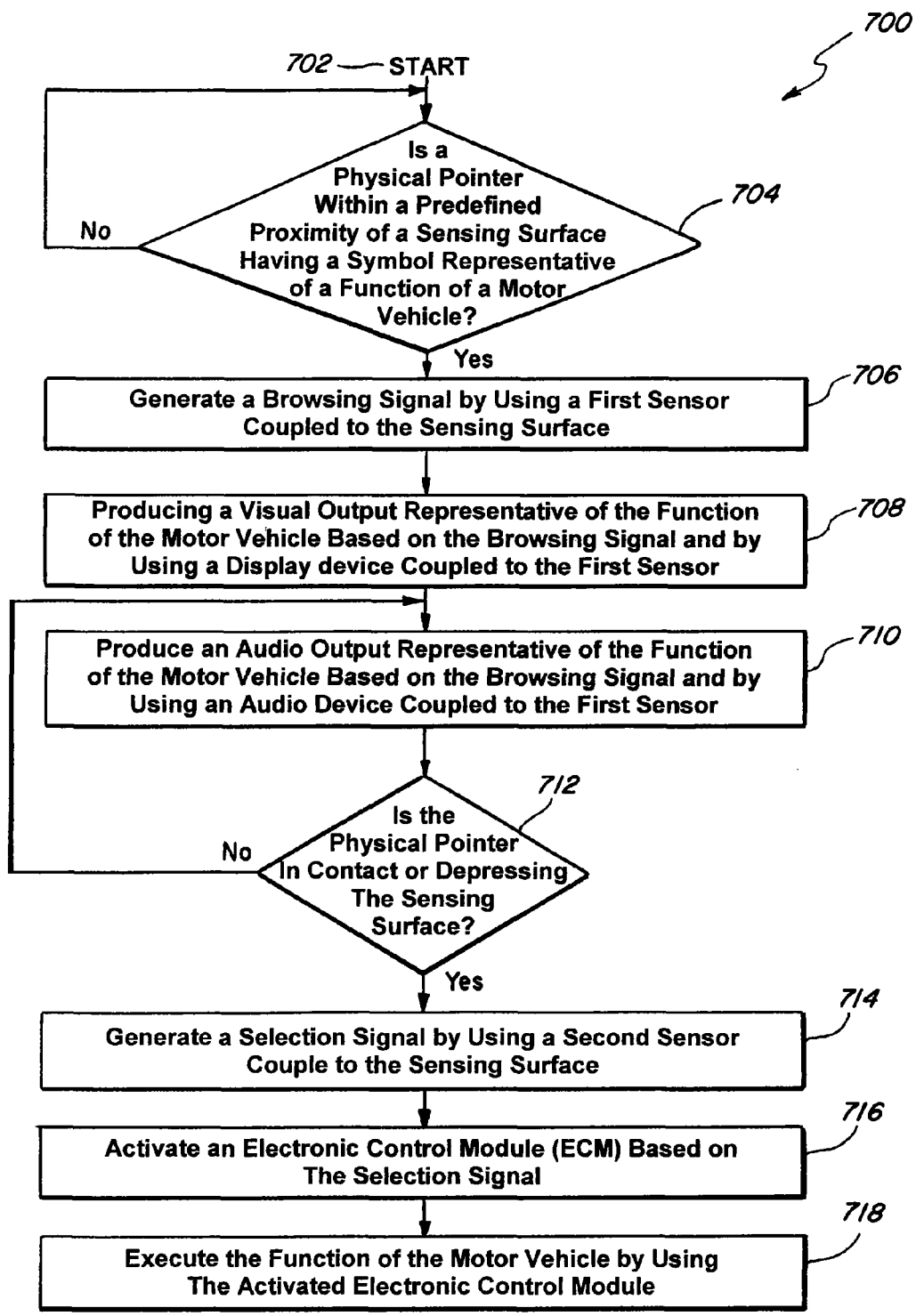
FIG. 7 shows a flow diagram of a method for operating an electronic control module interface system according to an embodiment of the present invention.

The discussion now turns to a method 700 for operating the electronic control module interface (ECMI) system, which may be shown in FIG. 7 according to an embodiment of the present invention. In step 702, the ECMI system may be initiated. In step 704, the system may determine whether a physical pointer may be within a predefined proximity of a sensing surface, which may have a symbol that represents a function of a motor vehicle. If the physical pointer is not yet within the predefined proximity of the sensing surface, the method 700 may return to step 704 to iteratively or periodically detect the presence of the physical pointer. Otherwise, the method 700 may proceed to step 706, in which a browsing signal may be generated by using a first sensor that may be coupled to the sensing surface.

In step 708, a visual output representing the function of the motor vehicle may be produced based on the browsing signal. More specifically, a display device may be coupled to the first sensor, such that it may be used for producing the visual output. In step 710, an audio output representing the function of the motor vehicle may be generated based on the browsing signal. More specifically, an audio device may be coupled to the first sensor, such that it may be used for producing the audio output.

In step 712, the ECMI system may determine whether the physical pointer may be in contact or depressing the sensing surface. If the physical pointer is not yet in contact or not yet depressing the sensing surface, the method 700 may return to step 712. Otherwise, the method 700 may proceed to step 714, in which a selection signal may be generated by using a second sensor that may be coupled to the sensing surface.

In step 716, an electronic control module may be activated based on the selection signal. In step 718, the function of the motor vehicle may be executed by using the activated electronic control module.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An electronic control module interface system, comprising:
   a sensing surface having a symbol representative of a function of a motor vehicle;
   a sensing device coupled to the sensing surface, and configured to sense a proximity between a physical pointer and the sensing surface when the physical pointer is not in physical contact with the sensing surface and to generate a browsing signal when the proximity is less than a predefined proximity threshold value; and
   an output device coupled to the sensing device, and configured to activate an output representative of the function of the motor vehicle upon receiving the browsing signal,
   wherein after the output is activated, the sensing device is configured to generate a selection signal when the physical pointer contacts or depresses the sensing surface, and the function of the motor vehicle changes based on the selection signal.

2. The system of claim 1, wherein the output device includes a display device, such that the output is a visual image of the symbol being enlarged or a text describing the function.

3. The system of claim 1, wherein the output device includes an audio device, such that the output is a voice output announcing the function.

4. The system of claim 1, wherein the output device includes a display device and an audio device, such that the output includes a visual image of the symbol being enlarged and a voice announcing the function.

5. The system of claim 1, wherein the sensing device is a device selected from a group consisting of a capacitive touch sensor, a proximity sensor, a mechanical sensor, a push stroke sensor and combinations thereof.

6. The system of claim 1, wherein the proximity is defined by a perpendicular distance between the physical pointer and the sensing surface.

7. The system of claim 1, wherein the predefined threshold value is greater than 0 cm and less than or equal to about 1 cm.

8. The system of claim 1, wherein the symbol describes the function of the motor vehicle.

9. The system of claim 1, wherein the function is selected from a group consisting of air conditioning control, front windshield defrost, back windshield defrost, automatic temperature control, fan speed control, air ventilation control, dual climate control, volume control, stereo system control, and combinations thereof.

10. An electronic control module interface system, comprising:
    a sensing surface having a symbol representative of a function of a motor vehicle;
    a first sensor coupled to the sensing surface, and configured to sense a perpendicular distance between a physical pointer and the sensing surface and to generate a browsing signal when the perpendicular distance is less than a predefined threshold value and greater than zero;
    a display device coupled to the first sensor, and configured to receive the browsing signal and to activate a visual output representative of the function of the motor vehicle upon receiving the browsing signal;
    a second sensor coupled to the sensing surface, wherein after the visual output is activated, the second sensor is configured to generate a selection signal when the physical pointer contacts or depresses the sensing surface; and
    an electronic control module (ECM) coupled to the second sensor, and configured to change the function of the motor vehicle based on the selection signal.

11. The system of claim 10, wherein the visual output includes an image of the symbol being enlarged.

12. The system of claim 10, wherein the visual output includes a text describing the function.

13. The system of claim 10, further comprising:
an audio device coupled to the first sensor, and configured to receive the browsing signal and to momentarily produce an audio output descriptive of the function of the motor vehicle upon receiving the browsing signal.

14. The system of claim 10, wherein:
the first sensor is a device selected from a group consisting of a capacitive touch sensor, a proximity sensor, and combinations thereof, and
the second sensor is a device selected from a group consisting of a capacitive touch sensor, a mechanical sensor, and combinations thereof.

15. The system of claim 10, wherein the predefined threshold value is greater than 0 cm and less than or equal to about 1 cm.

16. An electronic control module interface system, comprising:
a sensing surface having a symbol representative of a function of a motor vehicle;
a first sensor coupled to the sensing surface, and configured to sense a perpendicular distance between a physical pointer and the sensing surface when the physical pointer is not in physical contact with the sensing surface and to generate a browsing signal when the perpendicular distance is less than a predefined threshold value;
a display device coupled to the first sensor, and configured to receive the browsing signal and to momentarily produce a visual output upon receiving the browsing signal, the visual output enlarging the symbol and describing the function of the motor vehicle;
an audio device coupled to the first sensor, and configured to receive the browsing signal and to activate an audio output descriptive of the function of the motor vehicle upon receiving the browsing signal;
a second sensor coupled to the sensing surface, wherein after the audio output is activated, the second sensor is configured to generate a selection signal when the physical pointer contacts or depresses the sensing surface; and
an electronic control module (ECM) coupled to the second sensor, and configured to change the function of the motor vehicle based on the selection signal.

17. The system of claim 16, wherein the first sensor is a device selected from a group consisting of a capacitive touch sensor, a proximity sensor, and combinations thereof.

18. The system of claim 16, wherein the second sensor is a device selected from a group consisting of a capacitive touch sensor, a mechanical sensor, and combinations thereof.

19. The system of claim 16, wherein the predefined threshold value is greater than 0 cm and less than or equal to about 1 cm.

* * * * *